United States Patent
Borkenhagen et al.

(10) Patent No.: US 12,542,547 B2
(45) Date of Patent: Feb. 3, 2026

(54) REDUCING THE TIME TO SWITCH BETWEEN THE REDUNDANT CLOCK SIGNALS APPLIED TO A PHASE LOCK LOOP

(71) Applicant: International Business Machines Corporation, Armonk, NY (US)

(72) Inventors: John Borkenhagen, Rochester, MN (US); Christopher Steffen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 18/586,745

(22) Filed: Feb. 26, 2024

(65) Prior Publication Data

US 2025/0274111 A1   Aug. 28, 2025

(51) Int. Cl.
  *H03L 7/00* (2006.01)
  *H03K 5/14* (2014.01)
  *H03K 5/15* (2006.01)

(52) U.S. Cl.
  CPC .......... *H03K 5/14* (2013.01); *H03K 5/15093* (2013.01)

(58) Field of Classification Search
  CPC . H03L 7/196; H03L 7/199; H03L 7/07; H03L 7/087; H03L 7/093; H03L 7/18; H03L 7/085; H03L 7/10; H03L 7/08; H03L 7/0991; H03L 7/095; H03L 7/081; H03L 7/0995; H03L 7/089
  See application file for complete search history.

(56) References Cited

U.S. PATENT DOCUMENTS

| | | | |
|---|---|---|---|
| 4,598,257 A | 7/1986 | Southard | |
| 5,260,979 A | 11/1993 | Parker et al. | |
| 5,740,211 A | 4/1998 | Bedrosian | |
| 5,787,132 A | 7/1998 | Kishigami et al. | |
| 6,259,328 B1* | 7/2001 | Wesolowski | H03L 7/146 331/25 |
| 6,362,670 B1* | 3/2002 | Beaulieu | H03L 7/18 327/159 |
| 6,489,852 B1 | 12/2002 | Beaulieu | |
| 6,538,518 B1 | 3/2003 | Chengson | |

(Continued)

FOREIGN PATENT DOCUMENTS

EP   0517431 B1   11/1997

*Primary Examiner* — Tuan T Lam
(74) *Attorney, Agent, or Firm* — Shackelford, McKinley & Norton, LLP; Robert A. Voigt, Jr.

(57) ABSTRACT

A circuit for reducing a time to switch between the redundant clock signals applied to a phase lock loop. The circuit includes a phase frequency detector of the phase lock loop that detects a shift in the phase of a reference clock signal relative to the phase of a feedback clock signal. The circuit further includes a coarse tuning mechanism configured to delay the feedback clock signal until the feedback clock signal is aligned with a backup reference clock signal. Furthermore, the circuit includes a fine tuning mechanism configured to align the edge of the feedback clock signal with the edge of the backup reference clock signal, such as by utilizing a series of delay elements to delay the backup reference clock signal at different points in time and selecting the appropriate delayed backup reference clock signal whose edge is aligned with the edge of the feedback clock signal.

20 Claims, 5 Drawing Sheets

(56) References Cited

U.S. PATENT DOCUMENTS

| | | | |
|---|---|---|---|
| 6,744,323 B1* | 6/2004 | Moyal | H03L 7/104 |
| | | | 331/DIG. 2 |
| 6,748,036 B1 | 6/2004 | Tsurumaru | |
| 7,051,235 B2 | 5/2006 | Wu | |
| 7,126,429 B2* | 10/2006 | Mitric | H03L 7/143 |
| | | | 331/16 |
| 7,856,075 B2* | 12/2010 | Kon | H03L 7/143 |
| | | | 375/376 |
| 9,395,745 B2 | 7/2016 | Zhu et al. | |
| 11,108,400 B1* | 8/2021 | Armstrong | H03L 7/199 |
| 2006/0193417 A1* | 8/2006 | Jamison | G06F 1/12 |
| | | | 375/376 |
| 2016/0323092 A1 | 11/2016 | Handa et al. | |
| 2023/0035405 A1* | 2/2023 | Paschal | G06F 1/08 |
| 2024/0187006 A1* | 6/2024 | Fujita | H03K 5/1252 |

* cited by examiner

REDUCING THE TIME TO SWITCH BETWEEN THE REDUNDANT CLOCK SIGNALS APPLIED TO A PHASE LOCK LOOP

TECHNICAL FIELD

The present disclosure relates generally to a phase lock loop, and more particularly to reducing the time to switch between the redundant input clock signals applied to a phase lock loop by utilizing the phase frequency detector of the phase lock loop to sense for a switchover condition.

BACKGROUND

Phase lock loops (PLL) are found in a myriad of electronic applications, such as communication receivers and clock synchronization circuits in computer systems, for providing a reference signal with a known phase for clocking incoming and out-going data. A conventional PLL includes a phase detector for monitoring the phase difference between an input clock signal and the output signal of a voltage controlled oscillator (VCO) and generating an UP control signal and a DOWN control signal for a charge pump circuit which charges and discharges a loop filter at the input of the VCO. The UP and DOWN control signals drive the VCO to maintain a predetermined phase relationship between signals applied to the phase detector.

The output signal of the PLL must maintain a predetermined frequency of operation to be useful as a reference for clocking the incoming and out-going data. If the frequency of the input clock signal should drift, or even change to a radically different rate, the output signal of the VCO follows along and attempts to re-achieve phase lock thereto. Such behavior is inherent in the operation of the PLL.

Currently, phase lock indicators utilize various ways of detecting and reporting a momentary loss of phase lock. Yet, most if not all conventional phase lock indicators cannot distinguish the input frequency. Therefore, the output signal of the VCO locks to the new, albeit incorrect, frequency of the input clock signal, and the lock indicator again reports a valid phase lock status. The reference signal thus clocks the incoming and out-going data at the wrong points resulting in erroneous communication.

The input clock signal may also become stuck at the logical value of one or stuck at the value of zero causing the PLL to permanently lose phase lock. Since the PLL cannot lock to a DC signal, the phase lock indicator suspends the system operation. While it is informative to know of the permanent loss of phase lock, the phase lock indicator does nothing toward restoring operation of the system which may remain down until the input clock signal is repaired. In many applications, it is desirable and even imperative that the PLL remain operational even if the primary input clock signal becomes invalid as a reference.

As a result, a design has been introduced involving applying redundant input clocks signals to the phase lock loop. In such a design, the validity of the first input clock signal is determined. If the first input clock signal becomes invalid, then there is a switch to utilize the second input clock signal. Such switching is referred to as a "switchover."

Unfortunately, such switchovers may occur over a lengthy duration of time (e.g., 156 picoseconds) that results in discontinuities with the interface bit rate thereby causing difficulties in tracking such switchovers.

SUMMARY

In one embodiment of the present disclosure, a circuit for reducing a time to switch between redundant clock signals applied to a phase lock loop comprises the phase lock loop comprising a phase frequency detector configured to detect a shift in a phase of a reference clock signal of two redundant input clock signals applied to the phase lock loop relative to a phase of a feedback clock signal. The circuit further comprises a coarse tuning mechanism configured to delay the feedback clock signal until the feedback clock signal is aligned with a backup reference clock signal of the two redundant input clock signals. The circuit additionally comprises a fine tuning mechanism configured to align an edge of the feedback clock signal with an edge of the backup reference clock signal of the two redundant input clock signals.

Additionally, in one embodiment of the present disclosure, the fine tuning mechanism comprises one or more delay elements configured to delay the backup reference clock signal.

Furthermore, in one embodiment of the present disclosure, the one or more delay elements comprise one or more inverters.

Additionally, in one embodiment of the present disclosure, the fine tuning mechanism comprises one or more latches.

Furthermore, in one embodiment of the present disclosure, the one or more latches comprise one or more flip-flops.

Additionally, in one embodiment of the present disclosure, the fine tuning mechanism comprises an architecture for converting a thermometer code to decimal logic based on outputs of one or more latches.

Furthermore, in one embodiment of the present disclosure, the architecture comprises a plurality of XOR logic gates Additionally, in one embodiment of the present disclosure, an output of the architecture is used for selecting one of a plurality of delayed backup reference clock signals whose edge is aligned with the edge of the feedback clock signal.

Furthermore, in one embodiment of the present disclosure, the selecting is performed by a multiplexer.

Additionally, in one embodiment of the present disclosure, the coarse tuning mechanism comprises a shift register or a counter.

Furthermore, in one embodiment of the present disclosure, the coarse tuning mechanism comprises a divider configured to divide a frequency of the feedback clock signal to match a frequency of the backup reference clock signal.

In another embodiment of the present disclosure, a method for reducing a time to switch between redundant clock signals applied to a phase lock loop comprises detecting a shift in a phase of a reference clock signal of two redundant input clock signals applied to the phase lock loop relative to a phase of a feedback clock signal. The method further comprises performing a coarse tuning operation corresponding to delaying the feedback clock signal until the feedback clock signal is aligned with a backup reference clock signal of the two redundant input clock signals. The method additionally comprises performing a fine tuning operation corresponding to aligning an edge of the feedback clock signal with an edge of the backup reference clock signal.

Furthermore, in one embodiment of the present disclosure, the method additionally comprises dividing a frequency of the feedback clock signal to match a frequency of the backup reference clock signal by a divider.

Additionally, in one embodiment of the present disclosure, the method further comprises setting the divider to a period of a clock frequency.

Furthermore, in one embodiment of the present disclosure, the method additionally comprises outputting the feedback clock signal by a selector in response to detecting the shift in the phase of the reference clock signal relative to the phase of the feedback clock signal thereby causing a phase frequency detector of the phase lock loop to receive the feedback clock signal at both inputs of the phase frequency detector.

Additionally, in one embodiment of the present disclosure, a time duration of the aligning of the edge of the feedback clock signal with the edge of the backup reference clock signal corresponds to a delay of a delay element.

Furthermore, in one embodiment of the present disclosure, the delay element comprises an inverter.

Additionally, in one embodiment of the present disclosure, the method further comprises enabling the feedback clock signal to latch data into flip-flops, where the data corresponds to an edge of one of a plurality of delayed backup reference clock signals.

Furthermore, in one embodiment of the present disclosure, the method additionally comprises converting a thermometer code to decimal logic based on outputs of the flip-flips. Furthermore, the method comprises selecting one of the plurality of delayed backup reference clock signals using the decimal logic whose edge aligns with the edge of the feedback clock signal.

Additionally, in one embodiment of the present disclosure, the method further comprises propagating the aligned backup reference clock signal to the phase lock loop.

Accordingly, embodiments of the present disclosure reduce the time duration of the switchover. That is, embodiments of the present disclosure reduce the time duration involved in switching between an invalid input clock signal to a valid input clock signal that is propagated to the phase lock loop.

The foregoing has outlined rather generally the features and technical advantages of one or more embodiments of the present disclosure in order that the detailed description of the present disclosure that follows may be better understood. Additional features and advantages of the present disclosure will be described hereinafter which may form the subject of the claims of the present disclosure.

BRIEF DESCRIPTION OF THE DRAWINGS

A better understanding of the present disclosure can be obtained when the following detailed description is considered in conjunction with the following drawings, in which.

DETAILED DESCRIPTION

Figure 1:
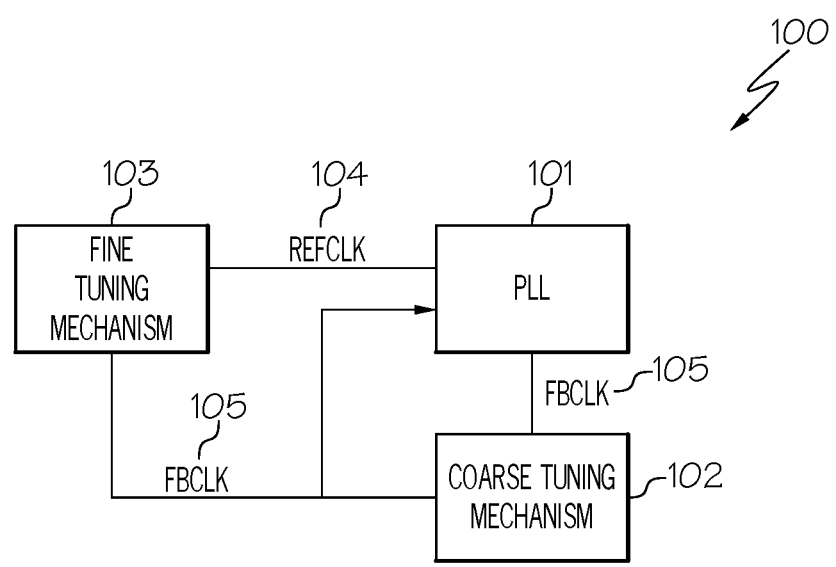
FIG. 1 illustrates an embodiment of the present disclosure of a circuit for reducing a time to switch between the redundant clock signals applied to a phase lock loop.

In one embodiment of the present disclosure, a circuit for reducing a time to switch between redundant clock signals applied to a phase lock loop comprises the phase lock loop comprising a phase frequency detector configured to detect a shift in a phase of a reference clock signal of two redundant input clock signals applied to the phase lock loop relative to a phase of a feedback clock signal. The circuit further comprises a coarse tuning mechanism configured to delay the feedback clock signal until the feedback clock signal is aligned with a backup reference clock signal of the two redundant input clock signals. The circuit additionally comprises a fine tuning mechanism configured to align an edge of the feedback clock signal with an edge of the backup reference clock signal of the two redundant input clock signals.

In this manner, the time duration of the switchover is greatly reduced. That is, the time duration involved in switching between an invalid input clock signal to a valid input clock signal that is propagated to the phase lock loop is greatly reduced.

Additionally, in one embodiment of the present disclosure, the fine tuning mechanism comprises one or more delay elements configured to delay the backup reference clock signal.

In this manner, the edge of the backup reference clock signal can be aligned with the edge of the feedback clock signal.

Furthermore, in one embodiment of the present disclosure, the one or more delay elements comprise one or more inverters.

In this manner, the duration of the switchover can correspond to the delay of a single delay element, such as an inverter.

Additionally, in one embodiment of the present disclosure, the fine tuning mechanism comprises one or more latches.

In this manner, the data corresponding to an edge of the backup reference clock signal is latched into the latches.

Furthermore, in one embodiment of the present disclosure, the one or more latches comprise one or more flip-flops.

In this manner, the data corresponding to an edge of the backup reference clock signal is latched into the one or more flip-flops.

Additionally, in one embodiment of the present disclosure, the fine tuning mechanism comprises an architecture for converting a thermometer code to decimal logic based on outputs of one or more latches.

In this manner, the appropriate delayed backup reference clock signal is selected based on the decimal logic.

Furthermore, in one embodiment of the present disclosure, the architecture comprises a plurality of XOR logic gates In this manner, the thermometer code is converted to decimal logic based on the outputs of the latch(es).

Additionally, in one embodiment of the present disclosure, an output of the architecture is used for selecting one of a plurality of delayed backup reference clock signals whose edge is aligned with the edge of the feedback clock signal.

In this manner, the appropriate delayed backup reference clock signal is selected corresponding to the delayed backup reference clock signal whose edge aligns with the edge of the feedback clock signal.

Furthermore, in one embodiment of the present disclosure, the selecting is performed by a multiplexer.

In this manner, a multiplexer is used for outputting the delayed backup reference clock signal whose edge aligns with the edge of the feedback clock signal.

Additionally, in one embodiment of the present disclosure, the coarse tuning mechanism comprises a shift register or a counter.

In this manner, the frequency of the feedback clock signal can be appropriately divided so as to match the frequency of the backup reference clock signal.

Furthermore, in one embodiment of the present disclosure, the coarse tuning mechanism comprises a divider configured to divide a frequency of the feedback clock signal to match a frequency of the backup reference clock signal.

In this manner, coarse tuning is performed so as to enable the switchover to occur with a period of the clock frequency.

In another embodiment of the present disclosure, a method for reducing a time to switch between redundant clock signals applied to a phase lock loop comprises detecting a shift in a phase of a reference clock signal of two redundant input clock signals applied to the phase lock loop relative to a phase of a feedback clock signal. The method further comprises performing a coarse tuning operation corresponding to delaying the feedback clock signal until the feedback clock signal is aligned with a backup reference clock signal of the two redundant input clock signals. The method additionally comprises performing a fine tuning operation corresponding to aligning an edge of the feedback clock signal with an edge of the backup reference clock signal.

In this manner, the time duration of the switchover is greatly reduced. That is, the time duration involved in switching between an invalid input clock signal to a valid input clock signal that is propagated to the phase lock loop is greatly reduced.

Furthermore, in one embodiment of the present disclosure, the method additionally comprises dividing a frequency of the feedback clock signal to match a frequency of the backup reference clock signal by a divider.

In this manner, coarse tuning is performed so as to enable the switchover to occur with a period of the clock frequency.

Additionally, in one embodiment of the present disclosure, the method further comprises setting the divider to a period of a clock frequency.

In this manner, coarse tuning is performed so as to enable the switchover to occur with a period of the clock frequency.

Furthermore, in one embodiment of the present disclosure, the method additionally comprises outputting the feedback clock signal by a selector in response to detecting the shift in the phase of the reference clock signal relative to the phase of the feedback clock signal thereby causing a phase frequency detector of the phase lock loop to receive the feedback clock signal at both inputs of the phase frequency detector.

In this manner, the alignment cycle during the performance of fine tuning can occur.

Additionally, in one embodiment of the present disclosure, a time duration of the aligning of the edge of the feedback clock signal with the edge of the backup reference clock signal corresponds to a delay of a delay element.

In this manner, the duration of the switchover can correspond to the delay of a single delay element.

Furthermore, in one embodiment of the present disclosure, the delay element comprises an inverter.

In this manner, the duration of the switchover can correspond to the delay of a single delay element, such as an inverter.

Additionally, in one embodiment of the present disclosure, the method further comprises enabling the feedback clock signal to latch data into flip-flops, wherein the data corresponds to an edge of one of a plurality of delayed backup reference clock signals.

In this manner, the data corresponding to one of the delayed backup reference clock signals is latched into the one or more flip-flops.

Furthermore, in one embodiment of the present disclosure, the method additionally comprises converting a thermometer code to decimal logic based on outputs of said flip-flips. Furthermore, the method comprises selecting one of the plurality of delayed backup reference clock signals using the decimal logic whose edge aligns with the edge of the feedback clock signal.

In this manner, the appropriate delayed backup reference clock signal is selected based on the decimal logic.

Additionally, in one embodiment of the present disclosure, the method further comprises propagating the aligned backup reference clock signal to the phase lock loop.

In this manner, the phase lock loop will lock onto the appropriate reference clock signal.

As stated above, phase lock loops (PLL) are found in a myriad of electronic applications, such as communication receivers and clock synchronization circuits in computer systems, for providing a reference signal with a known phase for clocking incoming and out-going data. A conventional PLL includes a phase detector for monitoring the phase difference between an input clock signal and the output signal of a voltage controlled oscillator (VCO) and generating an UP control signal and a DOWN control signal for a charge pump circuit which charges and discharges a loop filter at the input of the VCO. The UP and DOWN control signals drive the VCO to maintain a predetermined phase relationship between signals applied to the phase detector.

The output signal of the PLL must maintain a predetermined frequency of operation to be useful as a reference for clocking the incoming and out-going data. If the frequency of the input clock signal should drift, or even change to a radically different rate, the output signal of the VCO follows along and attempts to re-achieve phase lock thereto. Such behavior is inherent in the operation of the PLL.

Currently, phase lock indicators utilize various ways of detecting and reporting a momentary loss of phase lock. Yet, most if not all conventional phase lock indicators cannot distinguish the input frequency. Therefore, the output signal of the VCO locks to the new, albeit incorrect, frequency of the input clock signal, and the lock indicator again reports a valid phase lock status. The reference signal thus clocks the incoming and out-going data at the wrong points resulting in erroneous communication.

The input clock signal may also become stuck at the logical value of one or stuck at the value of zero causing the PLL to permanently lose phase lock. Since the PLL cannot lock to a DC signal, the phase lock indicator suspends the system operation. While it is informative to know of the permanent loss of phase lock, the phase lock indicator does nothing toward restoring operation of the system which may remain down until the input clock signal is repaired. In many applications, it is desirable and even imperative that the PLL remain operational even if the primary input clock signal becomes invalid as a reference.

As a result, a design has been introduced involving applying redundant input clocks signals to the phase lock loop. In such a design, the validity of the first input clock signal is determined. If the first input clock signal becomes invalid, then there is a switch to utilize the second input clock signal. Such switching is referred to as a "switchover."

Unfortunately, such switchovers may occur over a lengthy duration of time (e.g., 156 picoseconds) that results in discontinuities with the interface bit rate thereby causing difficulties in tracking such switchovers.

The embodiments of the present disclosure provide a means for reducing the duration of time of the switchover by performing coarse tuning and fine tuning. In one embodiment, coarse tuning is utilized for aligning the feedback clock signal, which is used to detect a shift in the phase of a reference clock signal (one of the redundant input clock signals to the phase lock loop), with the backup reference clock signal (the other redundant input clock signal to the phase lock loop). In one embodiment, such coarse tuning is performed by dividing the frequency of the feedback clock signal by a divider to match the frequency of the backup reference clock signal. Such a coarse tuning enables the switchover to occur with a period of the clock frequency, where the clock frequency signal matches the frequency of the backup reference clock signal by enabling an N−1 mode within the divider. The N−1 mode is then enabled by the redundant reference clock signal. Such a coarse tuning enables the switchover to occur with a period of the pre-divided clock frequency. In one embodiment, fine tuning is utilized for aligning the edge of the feedback clock signal with the edge of the backup reference clock signal. In one embodiment, fine tuning is performed by utilizing a series of delay elements to delay the backup reference clock signal at different points in time. In one embodiment, fine tuning is performed by enabling the feedback clock signal to latch data into latches, such as flip-flops, where the data corresponds to an edge of one of the delayed backup reference clock signals. The outputs of such latches are used by an architecture (e.g., XOR logic gates) to convert a thermometer code to decimal logic based on such outputs which is used by a selector to select the appropriate delayed backup reference clock signal, which corresponds to the backup reference clock signal whose edge is aligned with the edge of the feedback clock signal. In one embodiment, such an alignment is performed within the duration of time of a single delay element. In this manner, the time duration involved in switching between an invalid input clock signal to a valid input clock signal that is propagated to the phase lock loop is greatly reduced. A further description of these and other features will be provided below.

In some embodiments of the present disclosure, the present disclosure comprises a circuit for reducing a time to switch between the redundant clock signals applied to a phase lock loop. In one embodiment of the present disclosure, a phase frequency detector of the phase lock loop of the circuit detects a shift in the phase of a reference clock signal (one of the redundant input clock signals applied to the phase lock loop) relative to the phase of a feedback clock signal. A feedback clock signal, as used herein, refers to the clock signal outputted by the phase lock loop. The circuit further includes a coarse tuning mechanism configured to perform coarse tuning involving delaying the feedback clock signal until the feedback clock signal is aligned with a backup reference clock signal (the other redundant input clock signal) in response to detecting the shift in the phase of the reference clock signal relative to the phase of the feedback clock signal. In one embodiment, such coarse tuning is performed by dividing the frequency of the feedback clock signal by a divider to match the frequency of the backup reference clock signal. Such a coarse tuning enables the switchover to occur with a period of the pre-divided clock frequency. Furthermore, the circuit includes a fine tuning mechanism configured to perform fine tuning involving aligning the edge of the feedback clock signal with the edge of the backup reference clock signal. In one embodiment, fine tuning is performed by utilizing a series of delay elements to delay the backup reference clock signal at different points in time. In one embodiment, fine tuning is performed by enabling the feedback clock signal to latch data into latches, such as flip-flops, where the data corresponds to an edge of one of the delayed backup reference clock signals. The outputs of such latches are used by an architecture (e.g., XOR logic gates) to convert a thermometer code to decimal logic based on such outputs which is used by a selector to select the appropriate delayed backup reference clock signal, which corresponds to the backup reference clock signal whose edge is aligned with the edge of the feedback clock signal. In one embodiment, such an alignment is performed within the duration of time of a single delay element. As a result, the switchover occurs within the duration of time (e.g., 19 ps) of a single delay element, such as an inverter. In this manner, the time duration involved in switching between an invalid input clock signal to a valid input clock signal that is propagated to the phase lock loop is greatly reduced.

In the following description, numerous specific details are set forth to provide a thorough understanding of the present disclosure. However, it will be apparent to those skilled in the art that the present disclosure may be practiced without such specific details. In other instances, well-known circuits have been shown in block diagram form in order not to obscure the present disclosure in unnecessary detail. For the most part, details considering timing considerations and the like have been omitted inasmuch as such details are not necessary to obtain a complete understanding of the present disclosure and are within the skills of persons of ordinary skill in the relevant art.

Referring now to the Figures in detail, FIG. 1 illustrates an embodiment of the present disclosure of a circuit 100 for reducing a time to switch between the redundant clock signals applied to a phase lock loop.

As shown in FIG. 1, circuit 100 includes a phase lock loop (PLL) 101 configured to provide a signal ("feedback clock signal") with a known phase for clocking incoming and out-going data.

In one embodiment, PLL 101 is configured to receive a "reference clock signal" 104 ("REFCLK"). In one embodiment, reference clock signal 104 corresponds to one of a pair of redundant reference clock signals. In one embodiment, PLL 101 is configured to detect a shift in the phase of reference clock signal 104 relative to the phase of a "feedback clock signal" 105. Feedback clock signal 105 ("FBCLK"), as used herein, refers to the clock signal outputted by PLL 101.

In one embodiment, upon detecting a shift in reference clock signal 104 relative to the phase of feedback clock signal 105, coarse tuning is performed by coarse tuning mechanism 102. "Coarse tuning," as used herein, refers to delaying feedback clock signal 105 until feedback clock signal 105 is aligned with the backup reference clock signal. The "backup reference clock signal," as used herein, refers to the other reference clock signal of the pair of redundant reference clock signals that was not identified as having its phase shifted relative to the phase of feedback clock signal 105. In one embodiment, coarse tuning mechanism 102 performs coarse tuning, i.e., aligns the feedback clock signal with the backup reference clock signal, by delaying the feedback clock signal until the feedback clock signal is aligned with the backup reference clock signal, where the backup reference clock signal utilizes an N−1 mode.

In one embodiment, such an aligned feedback clock signal is then inputted to PLL 101 along with reference clock signal 104 ("REFCLK"), which in the case of detecting the shift in the phase of reference clock signal 104 relative to the phase of feedback clock signal 105 corresponds to a clock signal matching feedback clock signal 105 during a period of time, referred to herein as the "blackout period," as discussed further below.

Furthermore, in one embodiment, upon detecting a shift in reference clock signal 104 relative to the phase of feedback clock signal 105, fine tuning is performed by fine tuning mechanism 103.

"Fine tuning," as used herein, refers to aligning the edge of the feedback clock signal with the edge of the backup reference clock signal.

In one embodiment, fine tuning is performed by utilizing a series of delay elements to delay the backup reference clock signal at different points in time. In one embodiment, fine tuning is performed by enabling the feedback clock signal to latch data into latches, such as flip-flops, where the data corresponds to an edge of one of the delayed backup reference clock signals. The outputs of such latches are used by an architecture (e.g., XOR logic gates) to convert a thermometer code to decimal logic based on such outputs which is used by a selector to select the appropriate delayed backup reference clock signal, which corresponds to the backup reference clock signal whose edge is aligned with the edge of the feedback clock signal. In one embodiment, such an alignment is performed within the duration of time of a single delay element. In this manner, the time duration involved in switching between an invalid input clock signal to a valid input clock signal that is propagated to the phase lock loop (e.g., PLL 101) is greatly reduced.

A further description of such features, including the internal circuitry of PLL 101, coarse tuning mechanism 102 and fine tuning mechanism 103 is provided below in connection with FIG. 2.

Figure 2:
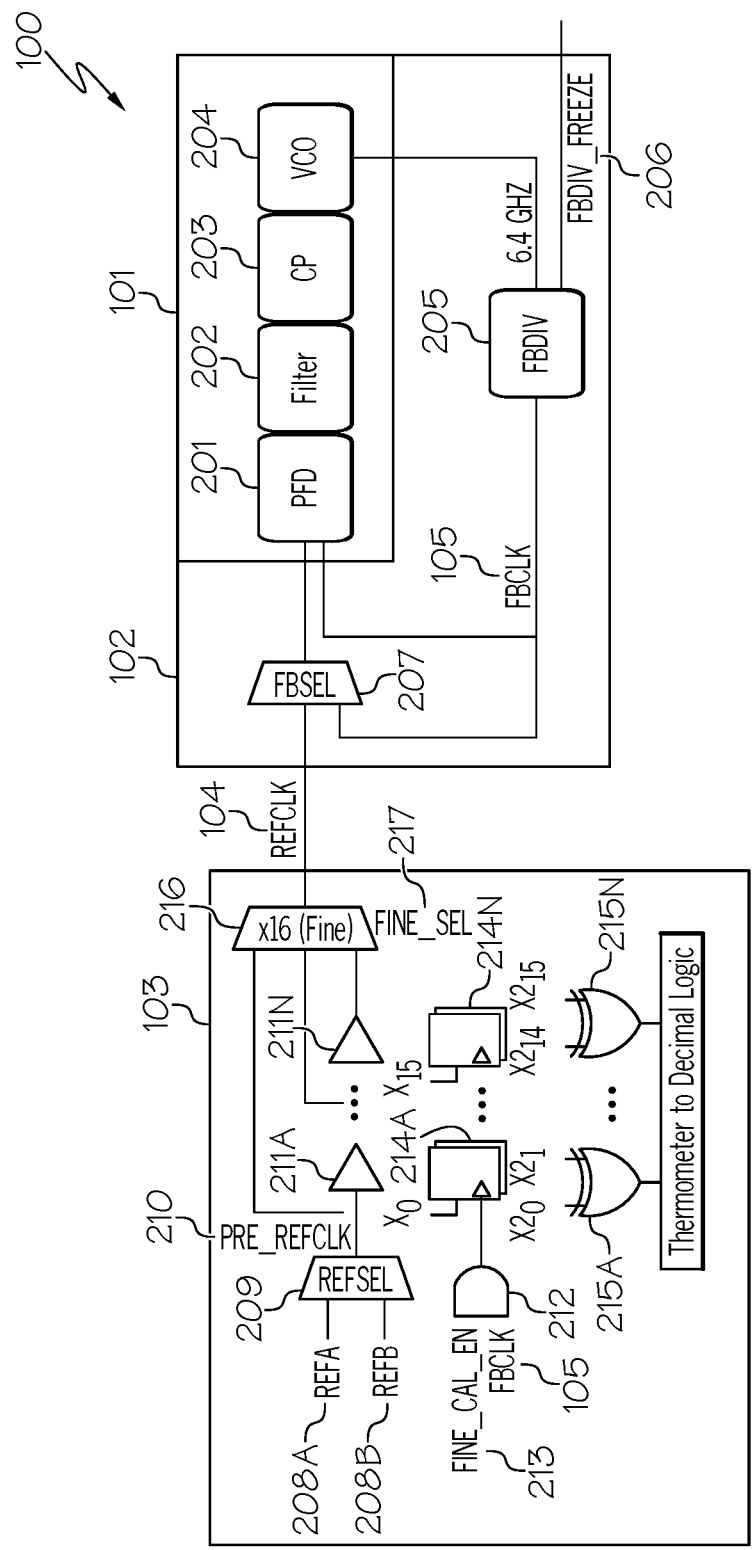
FIG. 2 illustrates the internal circuitry of the phase lock loop, the coarse tuning mechanism and the fine tuning mechanism in accordance with an embodiment of the present invention.

FIG. 2 illustrates the internal circuitry of the phase lock loop (e.g., PLL 101), the coarse tuning mechanism (e.g., coarse tuning mechanism 102) and the fine tuning mechanism (e.g., fine tuning mechanism 103) in accordance with an embodiment of the present invention.

As shown in FIG. 2, PLL 101 includes a phase frequency detector (PFD) 201 which compares the phase between two input signals, such as reference clock signal 104 and feedback clock signal 105, and generates outputs based on the phase difference between them. In one embodiment, PFD 201 corresponds to an edge triggered JK flip-flop phase frequency detector. In one embodiment, PFD 201 corresponds a dual D type phase comparator. In one embodiment, feedback clock signal 105 is the output signal of a voltage controlled oscillator 204.

In one embodiment, upon detecting a phase difference between reference clock signal 104 and feedback clock signal 105, PFD 201 generates an UP control signal and a DOWN control signal for a charge pump (CP) 203 which charges and discharges a loop filter 202 at the input of VCO 204. The UP and DOWN control signals drive VCO 204 to maintain a predetermined phase relationship between the signals applied to PFD 201.

The output signal of PLL 101 must maintain a predetermined frequency of operation to be useful as a reference for clocking the incoming and out-going data. If the frequency of the input clock signal should drift, or even change to a radically different rate, the output signal of VCO 204 follows along and attempts to re-achieve phase lock thereto. Such behavior is inherent in the operation of PLL 101.

Furthermore, as shown in FIG. 2, coarse tuning mechanism 102 includes a divider ("FBDIV") 205 configured to divide a frequency of feedback clock signal 105 from PLL 101 (e.g., 6.4 GHz) to match the frequency of the backup reference clock signal. A divider, such as divider 205, as used herein, refers to a counter. In one embodiment, the functionality of divider 205 is performed by a shift register. In one embodiment, such a divider 205 is digitally programmable. As will be discussed in greater detail below, upon detecting a phase difference between reference clock signal 104 and feedback clock signal 105, the backup reference clock signal is selected to replace reference clock signal 104 whose phase does not match the phase of feedback clock signal 105. The "backup reference clock signal," as used herein, refers to the other reference clock signal of the pair of redundant reference clock signals that was not identified as having its phase shifted relative to the phase of feedback clock signal 105.

In one embodiment, after divider 205 divides the frequency of feedback clock signal 105 from PLL 101 (e.g., 6.4 GHz) to match the frequency of the backup reference clock signal, divider 205 is set to a period of the clock frequency (e.g., 156 ps based on a clock frequency of 6.4 GHz) based on setting the value of the control logic signal, FBDIV_FREEZE signal 206, to the logical value of one.

In one embodiment, coarse tuning mechanism 102 further includes a selector 207 ("FBSEL") configured to select either feedback clock signal 105 or reference clock signal 104 emanating from fine tuning mechanism 103.

In one embodiment, as discussed in greater detail below, the output of selector 207 consists of reference clock signal 104 that corresponds to feedback clock signal 105, such as in the situation after coarse tuning is performed. In such a situation, PFD 201 receives feedback clock signal 105 at both its inputs. Such a situation occurs during a period of time referred to herein as the "blackout period" as discussed further below.

Additionally, as shown in FIG. 2, fine tuning mechanism 103 includes the redundant input clock signals to PLL 101, such as reference clock signal A 208A ("REFA") and reference clock signal B 208B ("REFB"). One of such reference clock signals 208A, 208B corresponds to the reference clock signal (REFCLK) 104 that is selected to be inputted to PLL 101.

In one embodiment, such signals 208A, 208B are inputted to a selector ("REFSEL") 209 configured to select one of such reference clock signals 208A, 208B (identified as "PRE_REFCLK" 210 in FIG. 2).

As will be discussed in greater detail below, such a reference clock signal 210 ("PRE_REFCLK") is delayed at various time intervals by a series of delay elements, such as inverter logic gates 211A-211N. Inverter logic gates 211A-211N may collectively or individually be referred to as inverters 211 or inverter 211, respectively.

In one embodiment, upon initiating fine tuning after detecting a shift in the phase of reference clock signal 104 with respect to the phase of feedback clock signal 105, selector 209 selects the backup reference clock signal. In such an embodiment, PRE-REFCLK 210 corresponds to the backup reference clock signal. For example, if REFA 208A corresponds to reference clock signal 104 whose phase was shifted with respect to the phase of feedback clock signal 105, then the backup reference clock signal would be REFB 208B.

Furthermore, as shown in FIG. 2, fine tuning mechanism 103 includes a logic gate, such as an AND logic gate 212, that receives feedback clock signal 105 as well as control signal ("FINE_CAL_EN") 213 configured to enable fine tuning to be performed upon being set to the logical value of one. In one embodiment, such a control signal enables fine tuning to be performed at the time divider 205 is set to the period of the clock frequency.

In one embodiment, the output of AND logic gate 212 enables feedback clock signal 105 to latch data into a series of flip-flops 214A-214N, where the data corresponds to an edge of one of the delayed backup reference clock signals. Flip-flops 214A-242N may collectively or individually be referred to as flip-flops 214 or flip-flop 214, respectively.

In one embodiment, flip-flops 214 receive a series of delayed backup reference clock signals (identified as $X_0 \ldots X_{15}$). Such delayed backup reference signals correspond to the reference clock signal (e.g., REFB 208B) selected by selector 209 that was delayed by inverters 211 at different time intervals. The outputs of flip-flops 214 correspond to a series of values (e.g., $X2_0 \ldots X2_{15}$) which are used by an architecture, such as XOR logic gates 215A-215N, to convert a thermometer code to decimal logic based on such outputs which is used by a selector 216 (e.g., multiplexer) to select the appropriate delayed backup reference clock signal, which corresponds to the backup reference clock signal whose edge aligns with the edge of feedback clock signal 105. XOR logic gates 215A-215N may collectively or individually be referred to as XOR logic gates 215 or XOR logic gate 215, respectively. A "thermometer code," as used herein, refers to representing a value by a sequence of 0s followed by a sequence of 1s, where the number of 1s corresponds to the value to be represented by the thermometer code. "Decimal logic," as used herein, refers to a value (base-10 representation) that is used to represent one of the delayed backup reference clock signals (e.g., one of the 16 delayed backup reference clock signals). In one embodiment, the decimal logic outputted by XOR logic gates 215 is used as the control signal 217 ("FINE_SEL") to enable selector 216 (e.g., multiplexer) to select the appropriate delayed backup reference clock signal, which corresponds to the backup reference clock signal whose edge aligns with the edge of feedback clock signal 105.

In one embodiment, such an alignment is performed within the duration of time (e.g., 19 ps) of a single delay element, such as an inverter (e.g., inverter 211). In this manner, the time duration involved in switching between an invalid input clock signal to a valid input clock signal that is propagated to the phase lock loop (e.g., PLL 101) is greatly reduced.

Figure 3:
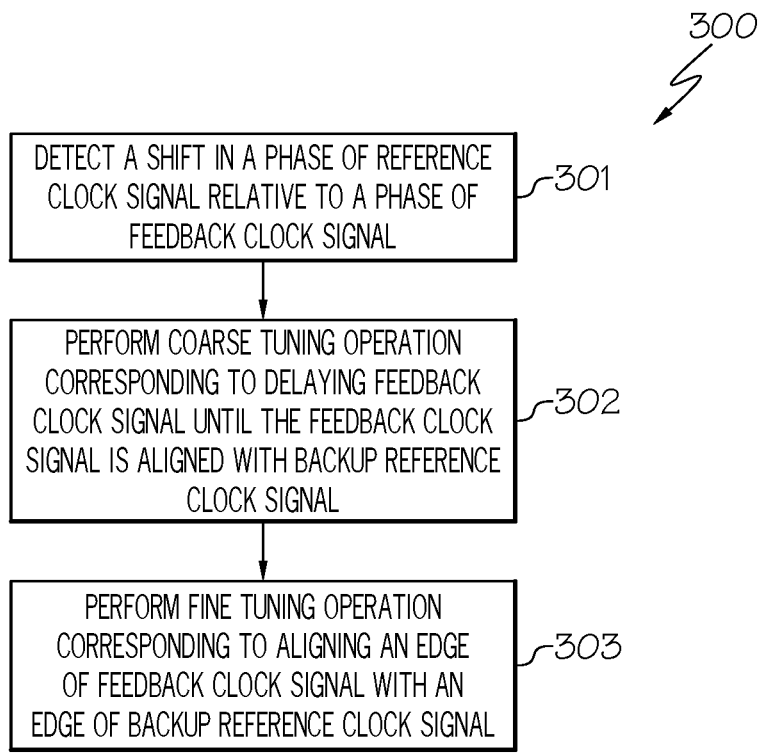
FIG. 3 is a flowchart of a method for reducing the time to switch between the redundant clock signals applied to a phase lock loop in accordance with an embodiment of the present disclosure.
Figure 4:
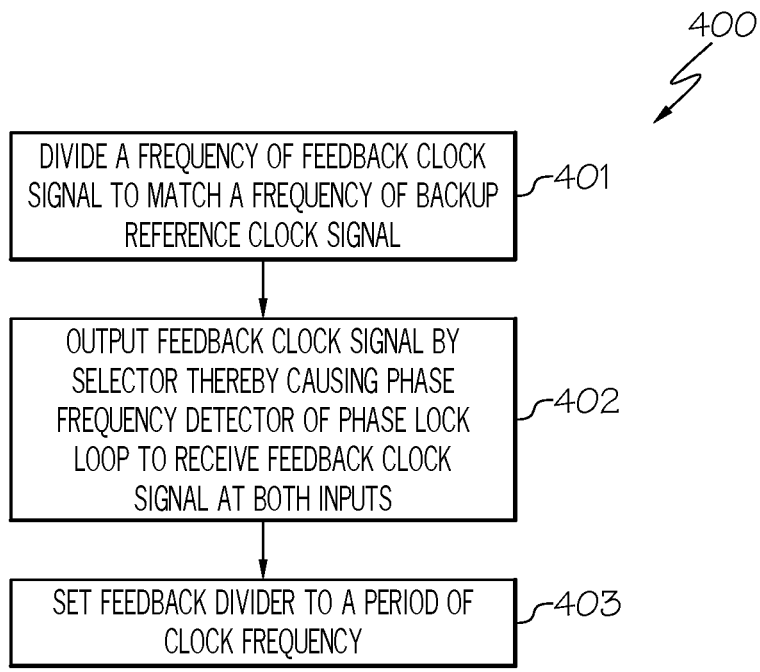
FIG. 4 is a flowchart of a method for performing the coarse turning operation in accordance with an embodiment of the present disclosure.
Figure 5:
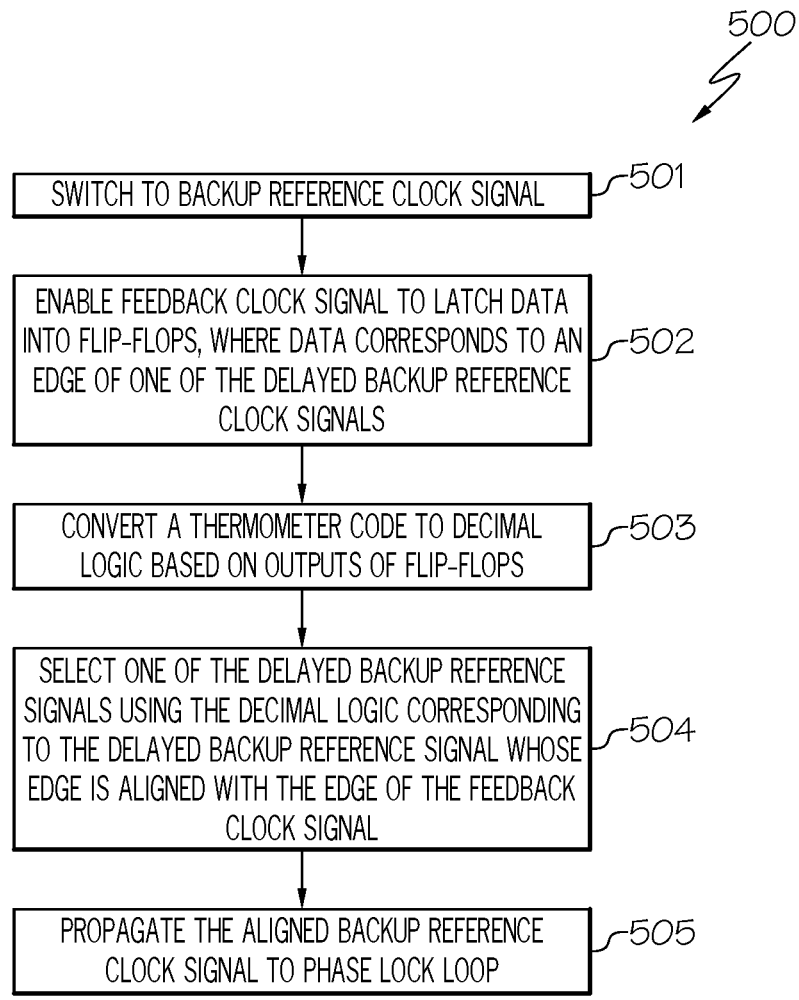
FIG. 5 is a flowchart of a method for performing the fine tuning operation in accordance with an embodiment of the present disclosure.
Figure 6:
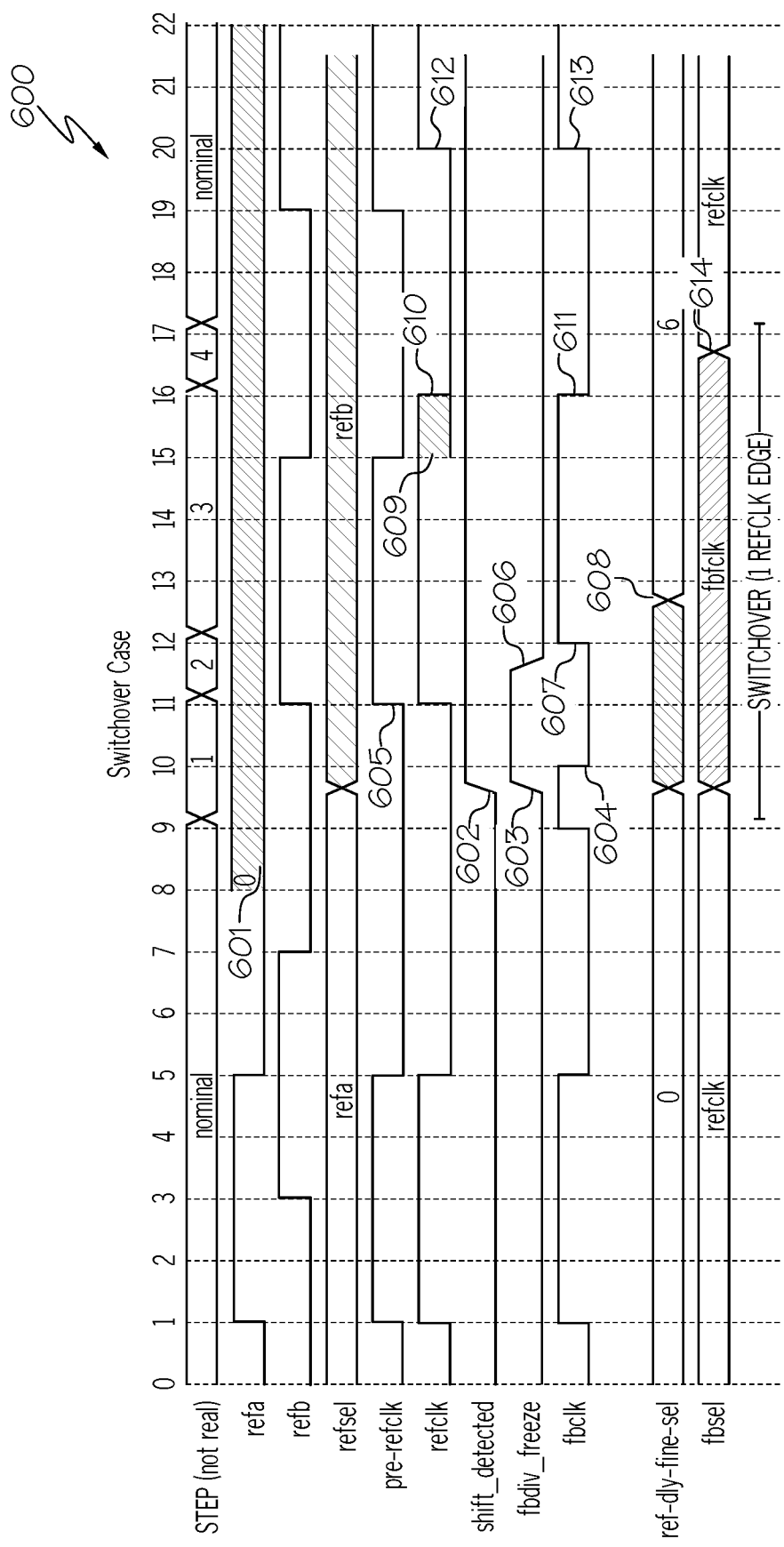
FIG. 6 is a timing diagram of the signals as a function of time during the switchover case in accordance with an embodiment of the present disclosure.

A further discussion regarding the functionality of the components of circuit 100 is provided below in connection with FIGS. 3-6. FIG. 3 is a flowchart of a method for reducing the time to switch between the redundant clock signals applied to a phase lock loop. FIG. 4 is a flowchart of a method for performing the coarse turning operation. FIG. 5 is a flowchart of a method for performing the fine tuning operation. FIG. 6 is a timing diagram of the signals as a function of time during the switchover case.

As stated above, FIG. 3 is a flowchart of a method 300 for reducing the time to switch between the redundant clock signals applied to a phase lock loop (e.g., PLL 101) in accordance with an embodiment of the present disclosure.

Referring to FIG. 3, in conjunction with FIGS. 1-2, in step 301, PFD 201 of PLL 101 detects a shift in the phase of reference clock signal 104 (REFCLK) relative to a phase of feedback clock signal 105 (FBCLK). As discussed above, such a reference clock signal is one of the redundant input clock signals 208 applied to PLL 101, such as REFA 208A.

Furthermore, as stated above, in one embodiment, PFD 201 corresponds to an edge triggered JK flip-flop phase frequency detector. In one embodiment, PFD 201 corresponds a dual D type phase comparator.

In step 302, coarse tuning mechanism 102 performs a coarse tuning operation. As discussed above, "coarse tuning," as used herein, refers to delaying feedback clock signal 105 until feedback clock signal 105 is aligned with the backup reference clock signal. The "backup reference clock signal," as used herein, refers to the other reference clock signal (e.g., REFB 208B) of the pair of redundant reference clock signals 208 that was not identified as having its phase shifted relative to the phase of feedback clock signal 105.

A discussion regarding performing coarse tuning is provided below in connection with FIG. 4.

FIG. 4 is a flowchart of a method 400 for performing the coarse turning operation in accordance with an embodiment of the present disclosure.

Referring to FIG. 4, in conjunction with FIGS. 1-3, in step 401, divider 205 ("FBDIV") divides a frequency of feedback clock signal 105 from PLL 101 to match the frequency of the backup reference clock signal. In this manner, feedback clock signal 105 is delayed until feedback clock signal 105 is aligned with the backup reference clock signal.

As stated above, in one embodiment, divider 205, as used herein, refers to a counter. In one embodiment, the functionality of divider 205 is performed by a shift register. In one embodiment, such a divider 205 is digitally programmable.

In one embodiment, the aligned feedback clock signal discussed above is then inputted to PLL 101 along with reference clock signal 104 ("REFCLK"), which in the case of detecting a shift in reference clock signal 104 relative to the phase of feedback clock signal 105, corresponds to a signal matching feedback clock signal 105 during a period of time, referred to herein as the "blackout period."

That is, during the blackout period, in step 402, selector 207 outputs reference clock signal 104 that corresponds to feedback clock signal 105 to phase frequency detector 201 of phase lock loop 101 thereby causing phase frequency detector 201 of phase lock loop 101 to receive feedback clock signal 105 at both inputs. During such a blackout period, the alignment cycle during fine tuning occurs as discussed below.

In step 403, after divider 205 divides the frequency of feedback clock signal 105 from PLL 101 (e.g., 6.4 GHz) to match the frequency of the backup reference clock signal, divider 205 is set to a period of the clock frequency (e.g., 156 ps based on a clock frequency of 6.4 GHz) based on setting the value of the control logic signal, FBDIV_FREEZE signal 206, to the logical value of one.

Returning to FIG. 3, in conjunction with FIGS. 1-2 and 4, in step 303, fine tuning mechanism 103 performs a fine tuning operation. "Fine tuning," as used herein, refers to aligning the edge of the feedback clock signal (e.g., feedback clock signal 105) with the edge of the backup reference clock signal.

A discussion regarding performing fine tuning is provided below in connection with FIG. 5.

FIG. 5 is a flowchart of a method 500 for performing the fine tuning operation in accordance with an embodiment of the present disclosure.

Referring to FIG. 5, in conjunction with FIGS. 1-4, in step 501, upon PFD 201 of PLL 101 detecting a shift in the phase of reference clock signal 104 (REFCLK) relative to a phase of feedback clock signal 105 (FBCLK), selector 209 selects the backup reference clock signal (e.g., reference clock signal 208B) so as to switch over to use the backup reference clock signal as input to PLL 101. In such an embodiment, PRE-REFCLK 210 corresponds to the backup reference clock signal (e.g., reference clock signal 208B). As discussed above, the "backup reference clock signal" refers to the other redundant clock signal 208 that was not identified as having its phase shifted relative to the phase of feedback clock signal 105. For example, if reference clock signal 208A was identified as having its phase shifted relative to the phase of feedback clock signal 105, then reference clock signal 208B is selected as the backup reference clock signal.

In step 502, AND logic gate 212 enables feedback clock signal 105 to latch data into a series of flip-flops 214, where the data corresponds to an edge of one of the delayed backup reference clock signals.

As stated above, reference clock signal 210 ("PRE_REFCLK"), which corresponds to the backup reference clock signal, is delayed at various time intervals by a series of delay elements, such as inverter logic gates 211.

Furthermore, as discussed above, in one embodiment, AND logic gate 212 receives feedback clock signal 105 as well as control signal 213 ("FINE_CAL_EN") configured to enable fine tuning to be performed upon being set to the logical value of one. In one embodiment, such a control signal enables fine tuning to be performed at the time divider 205 is set to the period of the clock frequency. In particular, such a control signal enables AND logic gate 212 to enable feedback clock signal 105 to latch data into a series of flip-flops 214, where the data corresponds to an edge of one of the delayed backup reference clock signals.

In step 503, XOR logic gates 215 convert a thermometer code to decimal logic based on the outputs of flip-flops 214.

As discussed above, in one embodiment, flip-flops 214 receive a series of delayed backup reference clock signals (identified as $X_0 \ldots X_{15}$). Such delayed backup reference signals correspond to the reference clock signal selected by selector 209 that was delayed by inverters 211 at different time intervals. The outputs of flip-flops 214 correspond to a series of values (e.g., $X2_0 \ldots X2_{15}$) which are used by an architecture, such as XOR logic gates 215, to convert a thermometer code to decimal logic based on such outputs which is used by a selector 216 (e.g., multiplexer) to select the appropriate delayed backup reference clock signal, which corresponds to the backup reference clock signal whose edge aligns with the edge of feedback clock signal 105. A "thermometer code," as used herein, refers to representing a value by a sequence of 0s followed by a sequence of 1s, where the number of 1s corresponds to the value to be represented by the thermometer code. "Decimal logic," as used herein, refers to a value (base-10 representation) that is used to represent one of the delayed backup reference clock signals (e.g., one of the 16 delayed backup reference clock signals).

In step 504, selector 216 selects one of the delayed backup reference clock signals using the decimal logic, which corresponds to the backup reference clock signal whose edge aligns with the edge of feedback clock signal 105.

As stated above, the decimal logic outputted by XOR logic gates 215 is used as the control signal 217 ("FINE_SEL") to enable selector 216 (e.g., multiplexer) to select the appropriate delayed backup reference clock signal, which corresponds to the backup reference clock signal whose edge aligns with the edge of feedback clock signal 105.

In one embodiment, the duration of time for such an alignment occurs within the duration of time (e.g., 19 ps) of a single delay element, such an inverter 211, which corresponds to the time to switch from one redundant clock signal to the other redundant clock signal to be used to be applied to PLL 101. In this manner, the time duration involved in switching between an invalid input clock signal to a valid input clock signal is greatly reduced.

In step 505, the aligned backup reference clock signal is propagated to phase lock loop 101, such as by selector 216 outputting the aligned backup reference clock signal to the input of selector 207.

A timing diagram of the switchover case using the principles of the present disclosure is provided below in connection with FIG. 6.

FIG. 6 is a timing diagram of the signals as a function of time during the switchover case.

Referring to FIG. 6, in conjunction with FIGS. 1-5, timing diagram 600 illustrates the values of the signals during the switchover case using the principles of the present disclosure. As shown in FIG. 6, at point 601, there was expected to be an edge for REFA 208A. However, since there was no edge, a phase shift was detected at point 601, which triggers a shift detected at point 602, which triggers the fbdiv_freeze signal 206 to be enabled at point 603, which causes feedback clock signal 105 (FBCLK) to have a value of 0 at point 604.

At the next reference clock signal cycle, which is shown by pre-refclock 210 and refclk 104 at point 605, the reference clock signal (refclk 104) goes high which releases fbdiv_freeze signal 206 at point 606, which causes feedback clock signal 105 to go high at point 607.

When feedback clock signal 105 goes high, it causes the reference delay line select (ref-dly-line-sel), referring to the architecture of flip-flops 214 and XOR gates 215 in selecting the appropriate delayed backup reference clock signal whose edge is aligned with the edge of feedback clock signal 105, to latch onto the data (e.g., value of 6) at point 608. The delay of latching onto the data affects the delay of selector 216 to output the aligned backup reference clock signal (aligned with feedback clock signal 105), where such a delay (see element 609) corresponds to the duration of the switchover (duration of time from switching to the other redundant input clock signal 208), which corresponds to the delay of a delay element (e.g., 19 ps), such as inverter 211. In this manner, the time duration involved in switching between an invalid input clock signal to a valid input clock signal that is propagated to the phase lock loop (e.g., PLL 101) is greatly reduced.

Furthermore, as shown in timing diagram 600, after aligning the backup reference clock signal with feedback clock signal 105, reference clock signal 104 (refclk) is aligned with feedback clock signal 105 (fbclk) as shown at points 610, 611, respectively. Such clock signals are also aligned at the next rising edge at points 612, 613, respectively. The aligned reference clock signal 104 (refclk) is then propagated to PLL 101 by selector 207 (fbsel) at point 614, which corresponds to the end of the blackout period when selector 207 (fbsel) no longer outputs feedback clock signal (fbclk) 105.

In this manner, the time duration of the switchover is greatly reduced. That is, the time duration involved in switching between an invalid input clock signal to a valid input clock signal that is propagated to the phase lock loop is greatly reduced.

Furthermore, the principles of the present disclosure improve the technology or technical field involving a phase lock loop.

As discussed above, phase lock loops (PLL) are found in a myriad of electronic applications, such as communication receivers and clock synchronization circuits in computer systems, for providing a reference signal with a known phase for clocking incoming and out-going data. A conventional PLL includes a phase detector for monitoring the phase difference between an input clock signal and the output signal of a voltage controlled oscillator (VCO) and generating an UP control signal and a DOWN control signal for a charge pump circuit which charges and discharges a loop filter at the input of the VCO. The UP and DOWN control signals drive the VCO to maintain a predetermined phase relationship between signals applied to the phase detector. The output signal of the PLL must maintain a predetermined frequency of operation to be useful as a reference for clocking the incoming and out-going data. If the frequency of the input clock signal should drift, or even change to a radically different rate, the output signal of the VCO follows along and attempts to re-achieve phase lock thereto. Such behavior is inherent in the operation of the PLL. Currently, phase lock indicators utilize various ways of detecting and reporting a momentary loss of phase lock. Yet, most if not all conventional phase lock indicators cannot distinguish the input frequency. Therefore, the output signal of the VCO locks to the new, albeit incorrect, frequency of the input clock signal, and the lock indicator again reports a valid phase lock status. The reference signal thus clocks the incoming and out-going data at the wrong points resulting in erroneous communication. The input clock signal may also become stuck at the logical value of one or stuck at the value of zero causing the PLL to permanently lose phase lock. Since the PLL cannot lock to a DC signal, the phase lock indicator suspends the system operation. While it is informative to know of the permanent loss of phase lock, the phase lock indicator does nothing toward restoring operation of the system which may remain down until the input clock signal is repaired. In many applications, it is desirable and even imperative that the PLL remain operational even if the primary input clock signal becomes invalid as a reference. As a result, a design has been introduced involving applying redundant input clocks signals to the phase lock loop. In such a design, the validity of the first input clock signal is determined. If the first input clock signal becomes invalid, then there is a switch to utilize the second input clock signal. Such switching is referred to as a "switchover." Unfortunately, such switchovers may occur over a lengthy duration of time (e.g., 156 picoseconds) that results in discontinuities with the interface bit rate thereby causing difficulties in tracking such switchovers.

Embodiments of the present disclosure improve such technology by implementing a circuit for reducing a time to switch between the redundant clock signals applied to a phase lock loop. A phase frequency detector of the phase lock loop of the circuit detects a shift in the phase of a reference clock signal (one of the redundant input clock signals applied to the phase lock loop) relative to the phase of a feedback clock signal. A feedback clock signal, as used herein, refers to the clock signal outputted by the phase lock loop. The circuit further includes a coarse tuning mechanism configured to delay the feedback clock signal until the feedback clock signal is aligned with a backup reference clock signal (the other redundant input clock signal) in response to detecting the shift in the phase of the reference clock signal relative to the phase of the feedback clock signal. Such a coarse tuning enables the switchover to occur with a period of the clock frequency. Furthermore, the circuit includes a fine tuning mechanism configured to align the edge of the feedback clock signal with the edge of the backup reference clock signal. In one embodiment, fine tuning is performed by utilizing a series of delay elements to delay the backup reference clock signal at different points in time. In one embodiment, fine tuning is performed by enabling the feedback clock signal to latch data into latches, such as flip-flops, where the data corresponds to an edge of one of the delayed backup reference clock signals. The outputs of such latches are used by an architecture (e.g., XOR logic gates) to convert a thermometer code based on such outputs to decimal logic which is used by a selector to select the appropriate delayed backup reference clock signal, which corresponds to the backup reference clock signal whose edge is aligned with the edge of the feedback clock signal. In one embodiment, such an alignment is performed within the duration of time of a single delay element. As a result, the switchover occurs within the duration of time of a single delay element, such as an inverter (e.g., 19 ps). In this manner, the time duration involved in switching between an invalid input clock signal to a valid input clock signal that is propagated to the phase lock loop is greatly reduced. Furthermore, in this manner, there is an improvement in the technical field involving a phase lock loop.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A circuit for reducing a time to switch between redundant clock signals applied to a phase lock loop, comprising:
   said phase lock loop comprising a phase frequency detector configured to detect a shift in a phase of a reference clock signal of two redundant input clock signals applied to said phase lock loop relative to a phase of a feedback clock signal;
   a coarse tuning mechanism configured to delay said feedback clock signal until said feedback clock signal is aligned with a backup reference clock signal of said two redundant input clock signals; and
   a fine tuning mechanism configured to align an edge of said feedback clock signal with an edge of said backup reference clock signal of said two redundant input clock signals.

2. The circuit as recited in claim 1, wherein said fine tuning mechanism comprises one or more delay elements configured to delay said backup reference clock signal.

3. The circuit as recited in claim 2, wherein said one or more delay elements comprise one or more inverters.

4. The circuit as recited in claim 1, wherein said fine tuning mechanism comprises one or more latches.

5. The circuit as recited in claim 4, wherein said one or more latches comprise one or more flip-flops.

6. The circuit as recited in claim 1, wherein said fine tuning mechanism comprises an architecture for converting a thermometer code to decimal logic based on outputs of one or more latches.

7. The circuit as recited in claim 6, wherein said architecture comprises a plurality of XOR logic gates.

8. The circuit as recited in claim 6, wherein an output of said architecture is used for selecting one of a plurality of delayed backup reference clock signals whose edge is aligned with said edge of said feedback clock signal.

9. The circuit as recited in claim 8, wherein said selecting is performed by a multiplexer.

10. The circuit as recited in claim 1, wherein said coarse tuning mechanism comprises a shift register or a counter.

11. The circuit as recited in claim 1, wherein said coarse tuning mechanism comprises a divider configured to divide a frequency of said feedback clock signal to match a frequency of said backup reference clock signal.

12. A method for reducing a time to switch between redundant clock signals applied to a phase lock loop, the method comprising:
    detecting a shift in a phase of a reference clock signal of two redundant input clock signals applied to said phase lock loop relative to a phase of a feedback clock signal;
    performing a coarse tuning operation corresponding to delaying said feedback clock signal until said feedback clock signal is aligned with a backup reference clock signal of said two redundant input clock signals; and
    performing a fine tuning operation corresponding to aligning an edge of said feedback clock signal with an edge of said backup reference clock signal.

13. The method as recited in claim 12 further comprising:
    dividing a frequency of said feedback clock signal to match a frequency of said backup reference clock signal by a divider.

14. The method as recited in claim 13 further comprising: setting said divider to a period of a clock frequency.

15. The method as recited in claim 12 further comprising:
    outputting said feedback clock signal by a selector in response to detecting said shift in said phase of said reference clock signal relative to said phase of said feedback clock signal thereby causing a phase frequency detector of said phase lock loop to receive said feedback clock signal at both inputs of said phase frequency detector.

16. The method as recited in claim 12, wherein a time duration of said aligning of said edge of said feedback clock signal with said edge of said backup reference clock signal corresponds to a delay of a delay element.

17. The method as recited in claim 16, wherein said delay element comprises an inverter.

18. The method as recited in claim 12 further comprising:
    enabling said feedback clock signal to latch data into flip-flops, wherein said data corresponds to an edge of one of a plurality of delayed backup reference clock signals.

19. The method as recited in claim 18 further comprising:
    converting a thermometer code to decimal logic based on outputs of said flip-flops; and
    selecting one of said plurality of delayed backup reference clock signals using said decimal logic whose edge aligns with said edge of said feedback clock signal.

20. The method as recited in claim 19 further comprising:
    propagating said aligned backup reference clock signal to said phase lock loop.

* * * * *